(12) United States Patent
Takemoto et al.

(10) Patent No.: US 9,461,549 B2
(45) Date of Patent: Oct. 4, 2016

(54) ELECTRIC POWER SOURCE DEVICE

(71) Applicant: DENSO CORPORATION, Kariya, Aichi-pref. (JP)

(72) Inventors: Yuuki Takemoto, Kariya (JP); Katsutoyo Misawa, Kariya (JP); Yuuichi Handa, Anjo (JP); Syotarou Yamasaki, Kariya (JP); Syuji Kurauchi, Nagoya (JP); Kenta Hatakenaka, Obu (JP)

(73) Assignee: DENSO CORPORATION, Kariya (JP)

( * ) Notice: Subject to any disclaimer, the term of this patent is extended or adjusted under 35 U.S.C. 154(b) by 266 days.

(21) Appl. No.: 14/339,859

(22) Filed: Jul. 24, 2014

(65) Prior Publication Data
US 2015/0029759 A1    Jan. 29, 2015

(30) Foreign Application Priority Data

Jul. 24, 2013 (JP) ................................. 2013-153638
Apr. 23, 2014 (JP) ................................... 2014-88981

(51) Int. Cl.
| | |
|---|---|
| *H01F 5/00* | (2006.01) |
| *H02M 3/00* | (2006.01) |
| *H02M 3/335* | (2006.01) |
| *B60L 11/00* | (2006.01) |
| *H02M 3/337* | (2006.01) |
| *H05K 1/18* | (2006.01) |
| *H05K 1/02* | (2006.01) |

(52) U.S. Cl.
CPC .......... *H02M 3/33507* (2013.01); *B60L 11/00* (2013.01); *H01F 5/00* (2013.01); *H02M 3/00* (2013.01); *H02M 3/337* (2013.01); *H05K 1/18* (2013.01); *H05K 1/0263* (2013.01); *H05K 2201/1003* (2013.01); *H05K 2201/10166* (2013.01); *H05K 2201/10174* (2013.01); *H05K 2201/10515* (2013.01)

(58) Field of Classification Search
CPC ......... H02M 3/335; H02M 3/00; H01F 5/00; H01F 27/00–27/30
USPC .................... 336/65, 200, 232; 361/760–766
See application file for complete search history.

(56) References Cited

U.S. PATENT DOCUMENTS

| | | | | |
|---|---|---|---|---|
| 3,409,805 A | * | 11/1968 | Whipple | ................ H05K 1/144 336/200 |
| 2013/0100634 A1 | * | 4/2013 | Okubo | .................... H01F 27/36 361/816 |
| 2013/0301312 A1 | * | 11/2013 | Konishi | ............... H02M 3/337 363/21.15 |
| 2015/0029757 A1 | * | 1/2015 | Kurauchi | .............. H02M 3/335 363/16 |

FOREIGN PATENT DOCUMENTS

JP    2012-213309    11/2012

* cited by examiner

*Primary Examiner* — Tuyen Nguyen
(74) *Attorney, Agent, or Firm* — Nixon & Vanderhye PC

(57) ABSTRACT

An electric power source device has a transformer, a primary-side semiconductor module, a secondary-side semiconductor module, a secondary-side electrical component, a base plate and a circuit substrate on which substrate-side electrical components are mounted. The primary-side semiconductor module has a larger exterior size than the secondary-side electrical component. The primary-side semiconductor module and the secondary-side electrical component form a stacked section. In the stacked section, the secondary-side electrical component is stacked, in a vertical direction, i.e. a direction of a normal line of a mounting surface of the base plate, on the primary-side semiconductor module. The primary-side semiconductor module is directly mounted on the mounting surface. At least a part of the substrate-side electrical components is arranged inside of the primary-side semiconductor module in a horizontal direction, and inside of a second surface of the stacked section toward the mounting surface along the normal line.

13 Claims, 14 Drawing Sheets

ELECTRIC POWER SOURCE DEVICE

CROSS-REFERENCE TO RELATED APPLICATION

This application is related to and claims priority from Japanese Patent Applications No. 2013-153638 filed on Jul. 24, 2013, and 2014-88981 filed on Apr. 23, 2014, the contents of which are hereby incorporated by reference.

BACKGROUND OF THE INVENTION

1. Field of the Invention

This present invention relates to electric power source devices to be used in hybrid vehicles, electric vehicles etc.

2. Description of the Related Art

Hybrid vehicles and electric vehicles usually use electric power source devices such as charging devices and direct current to direct current (DC-DC) converters. Such a charging device is usually equipped with the DC-DC converter. For example, a patent document Japanese patent laid open publication No. 2012-213309 has disclosed a conventional electric power source device. The electric power source device is generally comprised of a transformer, semiconductor elements, a smoothing circuit and a base plate. Such a transformer decreases and/or increases a direct current power (DC power) to a specified DC power. The semiconductor elements rectify an output voltage of the transformer. The smoothing circuit performs a process of smoothing the output voltage which has been rectified by the semiconductor elements. The transformer, the semiconductor elements, the smoothing circuit etc. are mounted on a mounting surface of the base plate. The semiconductor elements and at least one of the transformer and the smoothing circuit are stacked and arranged in a direction of a normal line of the mounting surface of the base plate. This arrangement reduces the overall surface area of the mounting surface of the base plate in a horizontal direction of the base plate.

However, the conventional technique disclosed in the patent document described above may cause the following problem. The electric power source device disclosed in the patent document 1 contains components having a different size. This often generates an unusable space around the components having a small exterior size when the components are stacked on the mounting surface of the base plate in order to make a stacked section. Accordingly, there is a demand to reduce the unusable space and effectively utilize the overall space on the mounting surface of the base plate in the electric power source device.

SUMMARY

It is therefore desired to provide an electric power source device having an improved structure capable of effectively utilizing an overall space formed on a mounting surface of a base plate and easily reducing an overall size of the electric power source device.

An exemplary embodiment provides an electric power source device having a transformer, a primary side semiconductor module, a secondary side semiconductor module, a secondary side circuit, a base plate and a circuit substrate. The transformer has a primary coil and a secondary coil. The primary side semiconductor components are equipped with semiconductor elements and connected to the primary coil of the transformer. The secondary side semiconductor components are equipped with semiconductor elements and connected to the secondary coil of the transformer. The secondary side circuit is formed by secondary side electrical components and the secondary side semiconductor components. The base plate has a mounting surface on which the transformer, the primary side semiconductor components, the secondary side semiconductor components and the secondary side electrical components are mounted. Substrate side electrical components are mounted on the circuit substrate. In the structure of the electric power source device, at least two selected from the primary side semiconductor components, the secondary side semiconductor components, and a combination of the transformer and the secondary side semiconductor components are stacked to form a stacked section in a direction of a normal line of the mounting surface of the base plate. Further, at least a part of the substrate side electrical components is arranged inside of an exterior part of a component having a maximum exterior size forming the stacked section in a horizontal direction, which is perpendicular to the direction of a normal line of the mounting surface of the base plate. Still further, this part of the substrate side electrical components is arranged inside of a second surface of the stacked section toward the mounting surface side in a vertical direction, where the second surface of the stacked section is opposing to a first surface of the stacked section which is directly in contact with the mounting surface of the base plate when viewed in the vertical direction which is parallel to the direction of the normal line of the mounting surface.

The electric power source device has one or more the stacked sections. In each of the stacked sections, two components selected from the primary side semiconductor components, the secondary side semiconductor components, and a combination of the transformer and the secondary side semiconductor components are stacked. The stacked section is mounted on the mounting surface of the base plate and arranged in the direction of the normal line of the mounting surface of the base plate. Further, at least a part of the substrate side electrical components is arranged inside of an exterior part of the component having the maximum exterior size forming the stacked section in the horizontal direction. The horizontal direction is perpendicular to the direction of the normal line of the mounting surface of the base plate. Still further, this part of the substrate side electrical components is arranged inside of the second surface of the stacked section toward the mounting surface side in the vertical direction. The second surface of the stacked section is opposing to the first surface of the stacked section. The first surface of the stacked section is directly in contact with the mounting surface of the base plate when viewed along the vertical direction which is parallel to the direction of the normal line of the mounting surface. This structure makes it possible to provide effective use for the space generated around the stacked section in the inside of the electric power source device.

That is, the stacked section has a structure in which at least two components having a different exterior size are stacked in the direction of the normal line of the mounting surface of the base plate. Accordingly, an unusable space is formed in the space adjacent to the component having a small exterior size in the horizontal direction which is perpendicular to the stacking direction of the stacked section, i.e. in the direction of the normal line of the mounting surface of the base plate. On the other hand, in particular, in the improved structure of the electric power source device according to the present invention, the substrate-side electrical component mounted on the circuit substrate is arranged in the unusable area formed in the space around, i.e. adjacent to the component having a small exterior size in the stacked section in the horizontal direction. This makes it possible to provide the miniaturized electric power source device because of effectively using such unusable space.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
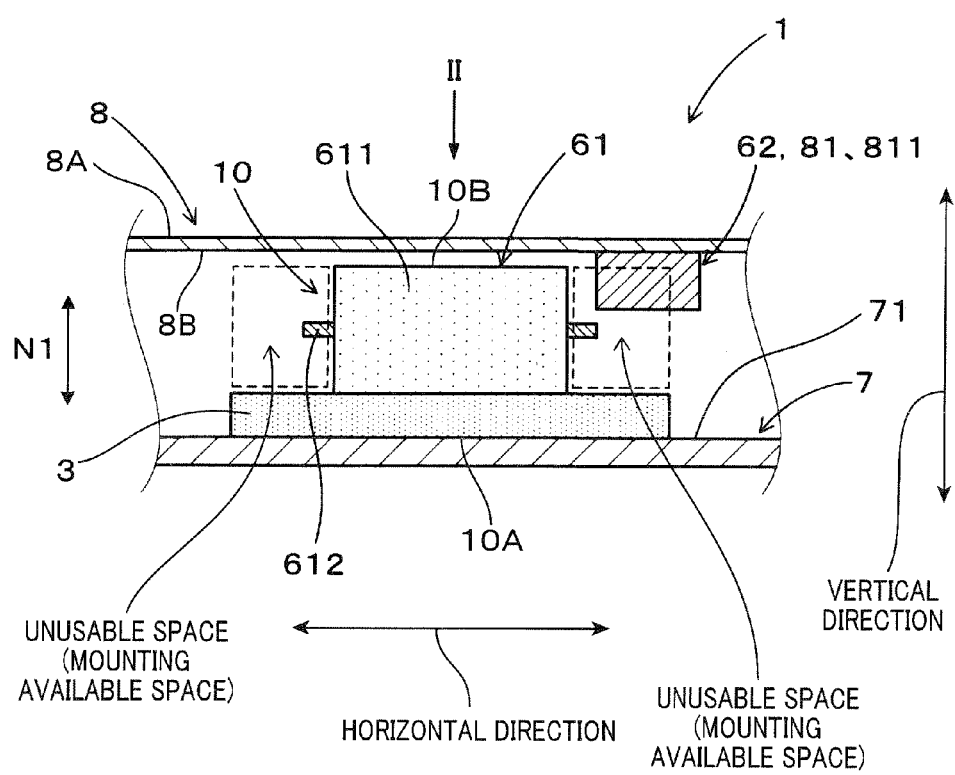
FIG. 1 is an explanatory view showing a structure of an electric power source device according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

In the structure of the electric power source device, it is possible to use semiconductor modules equipped with semiconductor elements having the same type or a different type, and discrete type semiconductor components as the primary side semiconductor components and the secondary side semiconductor components.

It is possible to mount the secondary side electrical components and other electrical components as the substrate side electrical components. It is possible to arrange the circuit substrate so that the direction of a normal line of the circuit substrate extends across the direction of a normal line of the mounting surface of the base plate. This arrangement allows the circuit substrate to be arranged next to the stacked section, and decreases an amount of heat energy generated in and provided from the stacked section. Accordingly, the arrangement prevents the circuit substrate from being influenced by excess heat energy.

It is possible for the electric power source device to have a structure in which the circuit substrate is arranged parallel to the base plate. In this structure, the substrate side electrical components are arranged in a specified part in a space formed between the circuit substrate and a component having a large exterior size in the stacked section, where this specified part is formed in a direction, which is perpendicular to a stacking direction of the stacked component, to a component having a small exterior size in the stacked section. This allows the electric power source device to effectively use the mounting space and have a close packed size.

Further, at least one stacked section has a structure in which the secondary side electrical component and one component selected from the primary side semiconductor component and the secondary side semiconductor component are stacked. Further it is possible for the electric power source device to have a substrate-mounting type transformer. For example, there are, as the substrate-mounting type transformer, pulse transformers capable of transmitting signals to semiconductor components, power source transformers capable of generating internal electric power, current transformers to be used for detecting a current, for example.

Because the stacked component is arranged next to the substrate-mounting type transformer, it is possible for the stacked component to shield noise generated in the substrate-mounting type transformer. As a result, this makes it possible to suppress the electric power source device according to the present invention having the improved structure previously described from emitting noise externally.

First Exemplary Embodiment

A description will now be given of an electric power source device 1 according to the first exemplary embodiment with reference to FIG. 1, FIG. 2 and FIG. 3.

FIG. 1 is an explanatory view showing the electric power source device 1 according to the first exemplary embodiment. FIG. 2 is a view showing the structure of the electric power source device 1 in a section taken along the line II shown in FIG. 1. FIG. 3 is a view showing a circuit structure of the electric power source device 1 according to the first exemplary embodiment shown in FIG. 1.

Figure 2:
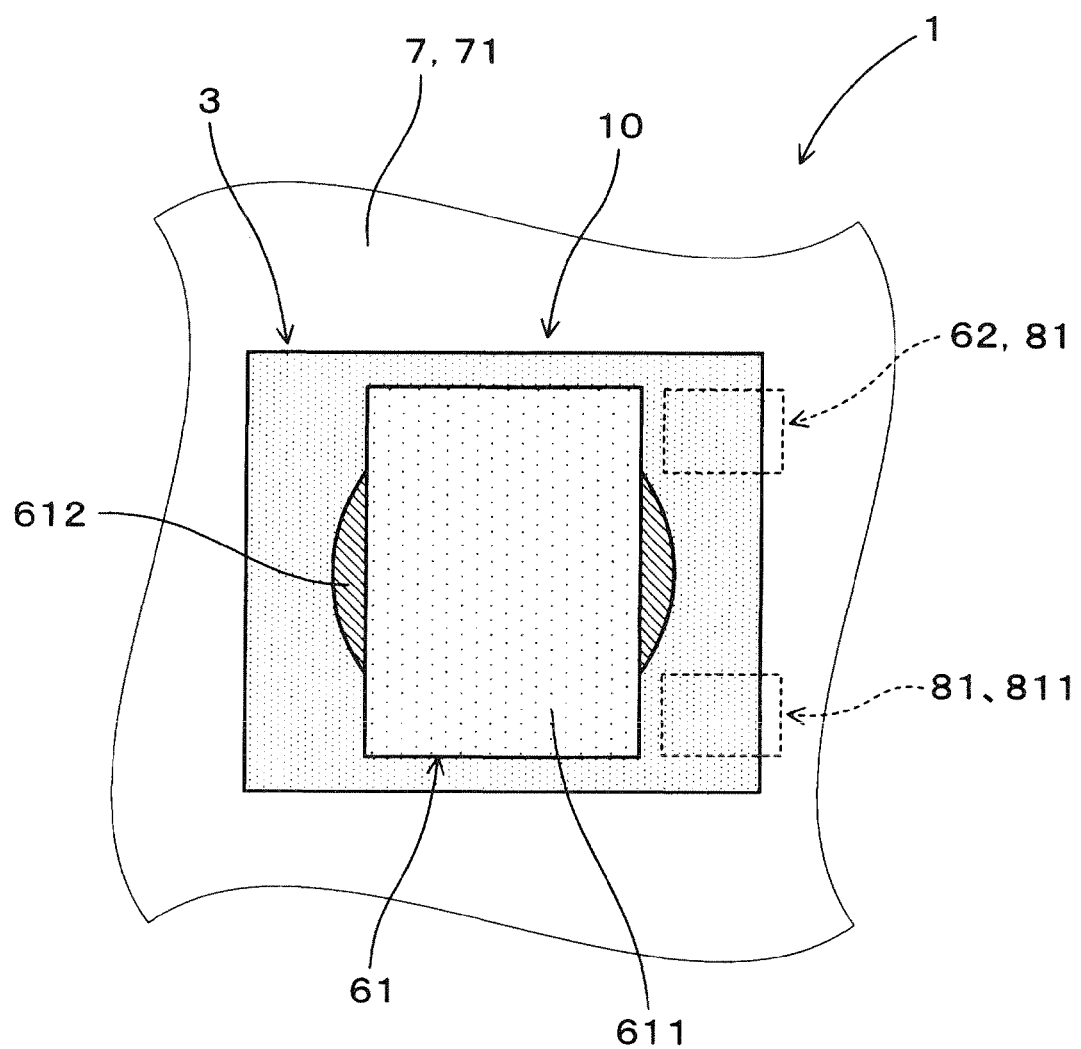
FIG. 2 is a view showing the structure of the electric power source device in a section taken along the line II shown in FIG. 1.
Figure 3:
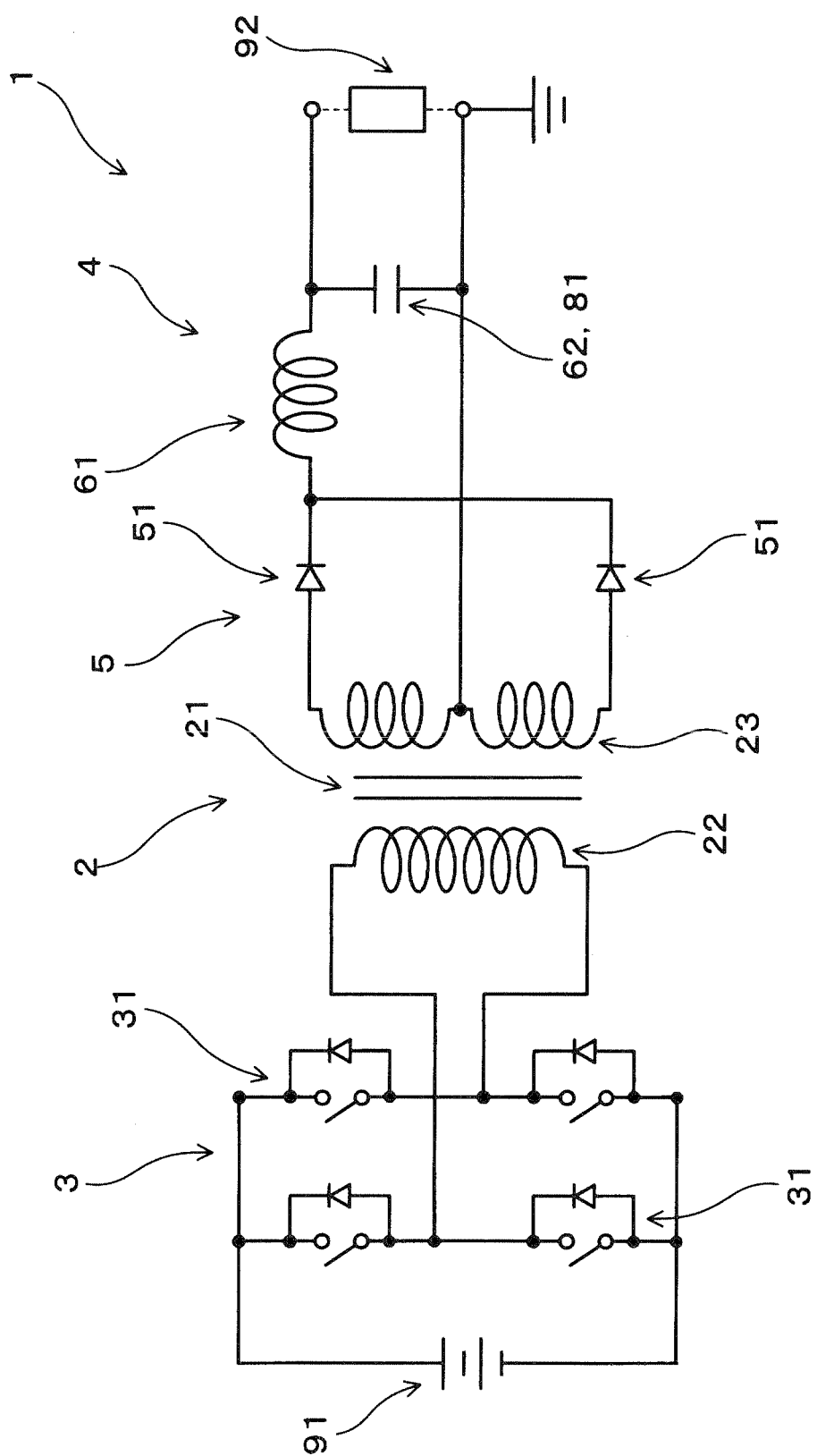
FIG. 3 is a view showing a circuit structure of the electric power source device according to the first exemplary embodiment shown in FIG. 1.

As shown in FIG. 1, FIG. 2 and FIG. 3, the electric power source device 1 according to the first exemplary embodiment is comprised of a transformer 2, a primary side semiconductor module 3, a secondary side semiconductor module 5, a choke coil 61, a base plate 7 and a circuit substrate 8.

The primary side semiconductor module 3 is a primary side semiconductor component which is connected to the transformer 2. The secondary side semiconductor module 5 is a secondary side semiconductor component which is connected to the transformer 2. The choke coil 5 is a secondary side electrical component. The choke coil 61 and the secondary side semiconductor module 5 form a secondary side circuit 4. The primary side semiconductor module 3, the choke coil 61 etc. are mounted on the base plate 7. The circuit substrate 8 has a front surface 8A and a back surface 8B shown in FIG. 1.

Substrate side electrical components 81 are mounted on a back surface 8B of the circuit substrate 8.

As shown in FIG. 3, the transformer 2 is equipped with a primary coil 22 and a secondary coil 23. The primary side semiconductor module 3 is equipped with a semiconductor element and connected to the primary coil 22 of the transformer 2. The secondary side semiconductor module 5 is equipped with the semiconductor element and connected to the secondary coil of the transformer.

Each of the primary side semiconductor module 3 and the secondary side semiconductor module 5 is equipped with the semiconductor element. As shown in FIG. 1 and FIG. 2, the primary side semiconductor module 3 and the choke coil 61 form a stacked section 10 in which the primary side semiconductor module 3 and the choke coil 61 are stacked on the mounting surface 71 of the base plate 7 along a direction of a normal line N1 of the mounting surface 71 so that the primary side semiconductor module 3 having a large exterior size is mounted directly on the mounting surface 71 when viewed along the direction of the normal line N1. As shown in FIG. 1, the stacked section 10 has a first surface 10A and a second surface 10B.

In the structure of the electric power source device 1 shown in FIG. 1, at least a part of the substrate side electrical components 81 is arranged inside of the exterior part of the primary side semiconductor module 3 in a horizontal direction in FIG. 1 which is perpendicular to the direction of the normal line N1 of the mounting surface 71 of the base plate 7. Further, this part of the substrate side electrical components 81 is arranged inside of the second surface 10B of the stacked section 10 toward the mounting surface 71 side in a vertical direction in FIG. 1. The second surface 10B of the stacked section 10 is opposing to the first surface 10A of the stacked section 10. The first surface 10A of the stacked section 10 is directly in contact with the mounting surface 71 of the base plate 7 when viewed along the vertical direction in FIG. 1 which is parallel to the direction of the normal line N1 of the mounting surface 71 of the base plate 7.

A description will now be given of the electric power source device 1 according to the first exemplary embodiment in detail. As shown in FIG. 3, the electric power source device 1 is equipped with the transformer 2 having the primary coil 22 and the secondary coil 23, the primary side semiconductor module 3, the secondary side semiconductor module 5, the choke coil 61 and a filtering capacitor 62. The primary side semiconductor module 3 is equipped with a plurality of switching elements 31. The secondary side semiconductor module 5 is equipped with rectifying elements 51.

The transformer 2 has the primary coil 22, a transfer core 21, a pair of the secondary coils 23. The primary coil 22 receives an alternating current (AC) voltage. A magnetic flux generated in the primary coil 22 when a current flows in the primary coil 22 is supplied to the transfer core 21. An electromotive force is generated in the pair of the secondary coils 23 when the magnetic flux in the transfer core 21 varies.

The four switching elements 31 in the primary side semiconductor module 3 form a full-bridge circuit. A gate terminal of the switching element 31 is connected to the circuit substrate 8 shown in FIG. 1. The circuit substrate 8 transmits control signals to the switching elements 31 in the primary side semiconductor module 3. The switch on and off operation of the switching element 31 is controlled on the basis of the received control signals in order to convert a DC voltage to an AC voltage.

When receiving a high DC voltage supplied from a high voltage power source 91, the primary side semiconductor module 3 converts the received high DC voltage to a high AC voltage. The transformer 2 decreases the high AC voltage to a specified low AC voltage. When receiving the low AC voltage supplied from the transformer 2, the secondary side semiconductor module 5 equipped with the two rectifying elements 51 rectifies the received low AC voltage to a low DC voltage. When receiving the low DC voltage supplied from the secondary side semiconductor module 5, the filter circuit composed of the choke coil 61 and the filtering capacitor 62 performs a smoothing operation on the received low DC voltage. A low voltage DC power source 92 charges the low DC voltage supplied from the filter circuit.

In the structure of the electric power source device shown in FIG. 1 and FIG. 2, the base plate 7 is made of metal such as a metal plate. The stacked section 10 is mounted and arranged on the upper surface, i.e. the mounting surface of the base plate 7. The circuit substrate 8 is arranged above the stacked section 10.

The stacked section 10 has the primary side semiconductor module 3 and the choke coil 61. The choke coil 61 is stacked on the primary side semiconductor module 3 in the direction of the normal line N1 of the base plate 7. The primary side semiconductor module 3 and the choke coil 61 are arranged in the stacked section 10 so that the center of the primary side semiconductor module 3 and the center of the choke coil 61 are aligned to each other along the normal line N1 of the base plate 7.

The choke coil 61 has a core 611 made of magnetic material and a winding 612 made of covered electric wire wound in the inside of the core 611.

As shown in FIG. 1, FIG. 2 and FIG. 3, the primary side semiconductor module 3 is equipped with switching elements as the semiconductor elements, for example insulated gate bipolar transistor (IGBT) and metal oxide semiconductor field effect transistors (MOS FET). The primary side semiconductor module 3 has a larger exterior size than the choke coil 61 when observed from the base plate 7 side toward the circuit substrate 6 along the direction of the normal line N1 of the mounting surface 71 of the base plate 7.

As shown in FIG. 1, the circuit substrate 6 is arranged parallel to the base plate 7 over the stacked section 10. The two substrate side electrical components 81 are mounted on the back surface 8B of the circuit substrate 6. The substrate side electrical components 81 are composed of a substrate-mounting type transformer 811 and a filtering capacitor 62.

The substrate-mounting type transformer 811 is a pulse transformer, a power source transformer, or a current transformer. The pulse transformer is used for transmitting control signals to semiconductor elements. The power source transformer generates electric power used in the inside components of the electric power source device. The current transformer is used for detecting a current.

The substrate-mounting type transformer 811 has a substrate-side primary coil, a substrate-side core and a substrate-side secondary coil. The substrate-side primary coil receives a primary voltage and a primary current. A magnetic flux generated in the substrate-side primary coil passes through the substrate-side core. An electromotive force is generated in the substrate-side secondary coil on the basis of the change of the magnetic flux in the substrate-side core.

As shown in FIG. 1 and FIG. 2, a part of each of the substrate side electrical components 81 is arranged inside of an exterior part of the primary side semiconductor module 3 forming the stacked section 10 in the horizontal direction. The horizontal direction is perpendicular to the direction of the normal line N1 of the mounting surface 71 of the base plate 7. Further, this part of the substrate side electrical component 81 is arranged inside of the second surface 10B of the stacked section 10 toward the mounting surface 71 side in the vertical direction. The second surface 10B of the stacked section 10 is opposing to the first surface 10A of the stacked section 10. As clearly shown in FIG. 1, the first surface 10A of the stacked section 10 is directly in contact with the mounting surface 71 of the base plate 7 when viewed along the vertical direction which is parallel to the direction of the normal line of the mounting surface 71. That is, each of the substrate side electrical components 81 is arranged in a concave space formed between or surrounded by the upper surface of the primary side semiconductor module 3 in the stacked section 10 and the side surface of the choke coil 61.

A description will now be given of the action and effects of the electric power source device 1 according to the first exemplary embodiment.

The electric power source device 1 has the stacked section 10. In the stacked section 10, the choke coil 3 is the secondary side electrical component is stacked on the primary side semiconductor module 3. In particular, at least a part of the substrate side electrical components 81 is arranged inside of an exterior part of the primary side semiconductor module 3 in the horizontal direction which is perpendicular to the direction of the normal line N1 of the mounting surface 71. Further, this part of the substrate side electrical component 81 is arranged inside of the second surface 10B of the stacked section 10 toward the mounting surface 71 side in the vertical direction. The second surface 10B of the stacked section 10 is opposing to the first surface 10A of the stacked section 10. This structure makes it possible to provide effective use of the space formed around the stacked section 10 in the inside of the electric power source device 1.

The stacked section 10 is composed of the two components which are stacked on the mounting surface 71 of the base plate 7 in the direction of the normal line N1 of the mounting surface 71 shown in FIG. 1. This structure makes an unusable space surrounded by the choke coil 61 having a small exterior size and the primary side semiconductor module 3 having a large exterior size.

The electric power source device 1 according to the first exemplary embodiment has the improved structure which effectively uses the unusable area, i.e. reduces the unusable size, in which a part of the substrate side electrical component 81 is arranged in the inside of the unusable space. This improved structure can reduce the overall size of the electric power source device 1, and provide the miniaturized electric power source device 1.

Further, the electric power source device 1 has the stacked section 10 and the substrate side electrical components 81. The stacked section 10 is composed of the primary side semiconductor module 3 and the choke coil 61 and the choke coil 61 is stacked on the primary side semiconductor module 3. The substrate-mounting type transformer 811 is used as the substrate side electrical components 81. In the improved structure of the electric power source device 1, the stacked section 10 is arranged next to the substrate-mounting type transformer 811. This arrangement allows the stacked section 10 to shield the electromagnetic noise generated in the substrate-mounting type transformer 811 with high efficiency. This makes it possible to increase noise prevention performance of the electric power source device 1.

Furthermore, the electric power source device 1 has the filtering capacitor 62 as the substrate side electrical component 81. Because of using the filtering capacitor 62 having a relatively large exterior size as the substrate side electrical component 81, the electric power source device 1 allows the electric power source device 1 to effectively use the arrangement space including the unusable space (or a mounting available space). Further, it is possible for the stacked section 10 to shield the electromagnetic noise generated in the filtering capacitor 62 because the stacked section 10 is arranged next to the filtering capacitor 62. This arrangement makes it possible to improve the noise prevention performance of the electric power source device 1.

The first exemplary embodiment shows the structure in which the filtering capacitor 62 is arranged at the output side of the electric power source device 1. However, the concept of the present invention is not limited by this arrangement. It is acceptable to arrange the filtering capacitor 62 at the input side of the electric power source device 1. The first exemplary embodiment provides the electric power source device having a miniaturized size obtained by the effectively-used arrangement space containing the unusable space (or the mounting available space).

Second Exemplary Embodiment

A description will be given of the electric power source device 1 according to the second exemplary embodiment with reference to FIG. 4 and FIG. 5.

Figure 4:
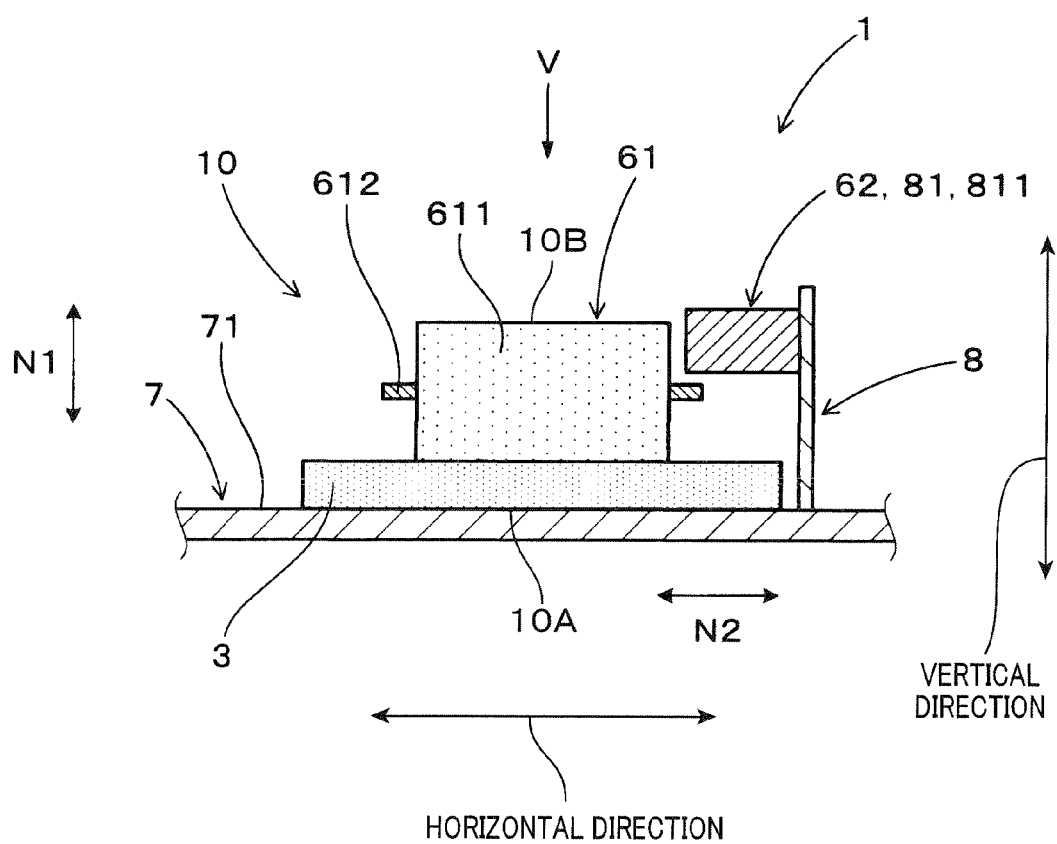
FIG. 4 is an explanatory view showing a structure of an electric power source device according to a second exemplary embodiment of the present invention.

FIG. 4 is an explanatory view showing a structure of the electric power source device 1 according to the second exemplary embodiment. FIG. 5 is a sectional view showing the structure of the electric power source device 1 taken along the line V shown in FIG. 4.

Figure 5:
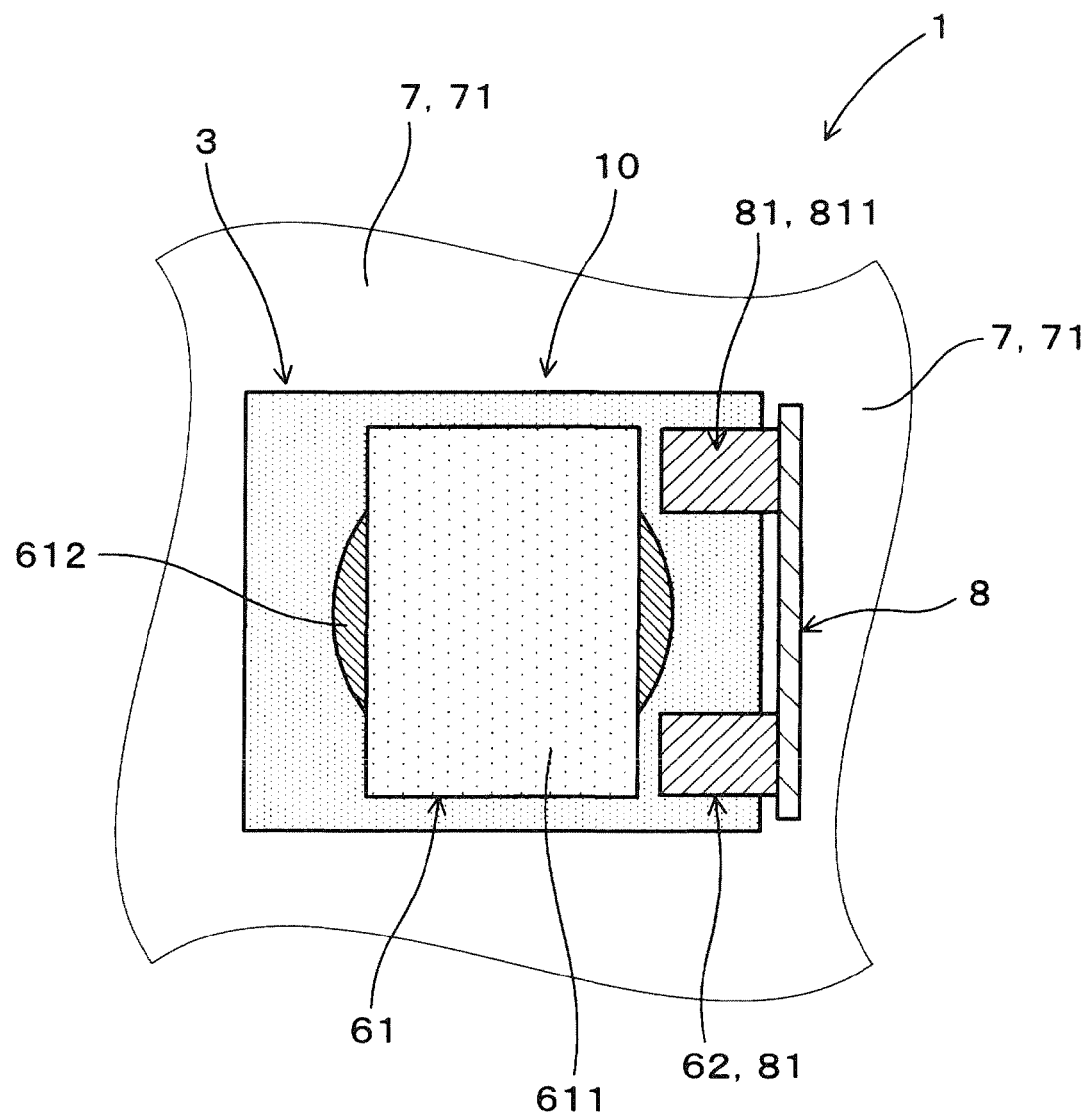
FIG. 5 is a sectional view showing the structure of the electric power source device taken along the line V shown in FIG. 4.

As shown in FIG. 4 and FIG. 5, the circuit substrate 8 is arranged so that the direction of a normal line N2 of the circuit substrate 8 becomes perpendicular to the direction of the normal line N2 of the base plate 7. That is, the direction of the normal line N2 is a horizontal line in FIG. 4 and the direction of the normal line N1 is a vertical line in FIG. 4. Accordingly, the circuit substrate 8 is arranged at the right side on the mounting surface 71 of the base plate 7 along the direction of the normal line N1 of the base plate 7.

As clearly shown in FIG. 4 and FIG. 5, the substrate side electrical components 81 are arranged on the circuit substrate 8 to face the stacked section 10. The same components between the second exemplary embodiment and the first exemplary embodiment will be referred to with the same reference numbers.

In the structure of the electric power source device 1 according to the second exemplary embodiment, the circuit substrate 8 is arranged so that the direction of the normal line N2 of the circuit substrate 8 extends intersecting the direction of the normal line N1 of the base plate 7. This structure makes it possible to arrange the circuit substrate 8 at the right side (or at the left side which is omitted from FIG. 4) on the mounting surface 71 of the base plate 7. It is possible for the structure of the circuit substrate 8 to shield heat energy generated in the stacked section 10. Further, the electric power source device 1 according to the second exemplary embodiment has the same effects of the electric power source device 1 according to the first exemplary embodiment.

Third Exemplary Embodiment

A description will be given of the electric power source device 1 according to the third exemplary embodiment with reference to FIG. 6 and FIG. 7.

Figure 6:
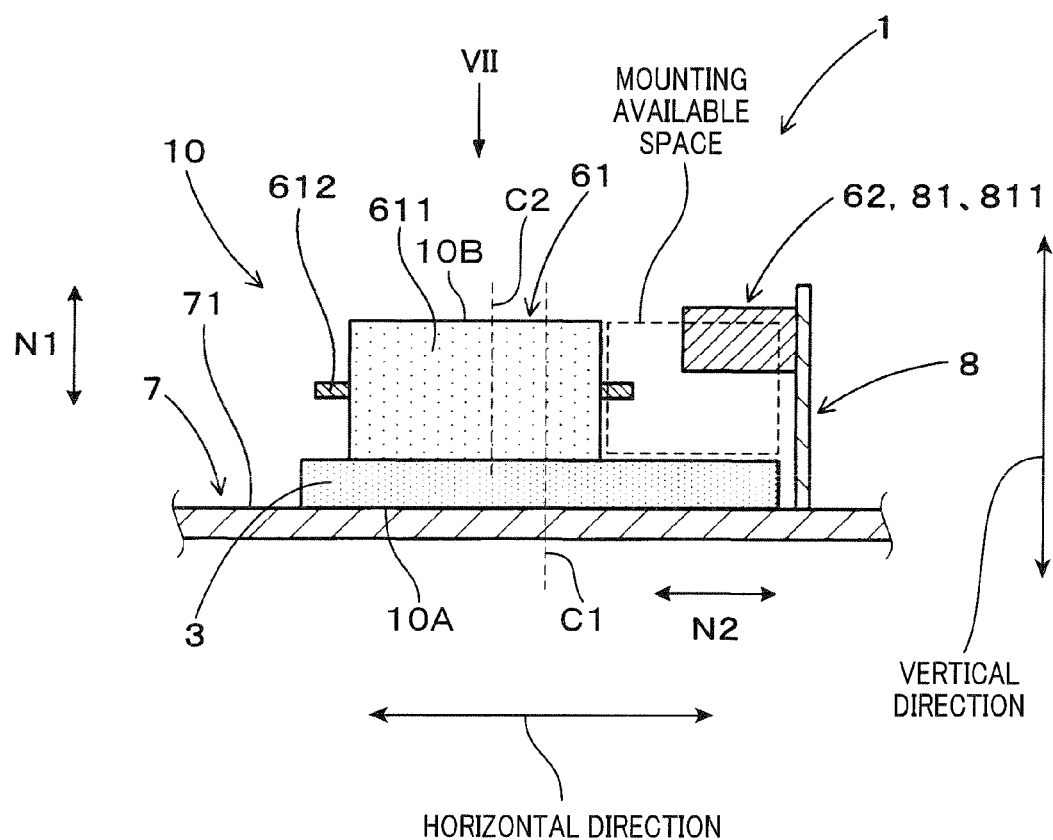
FIG. 6 is an explanatory view showing a structure of an electric power source device according to a third exemplary embodiment of the present invention.
Figure 7:
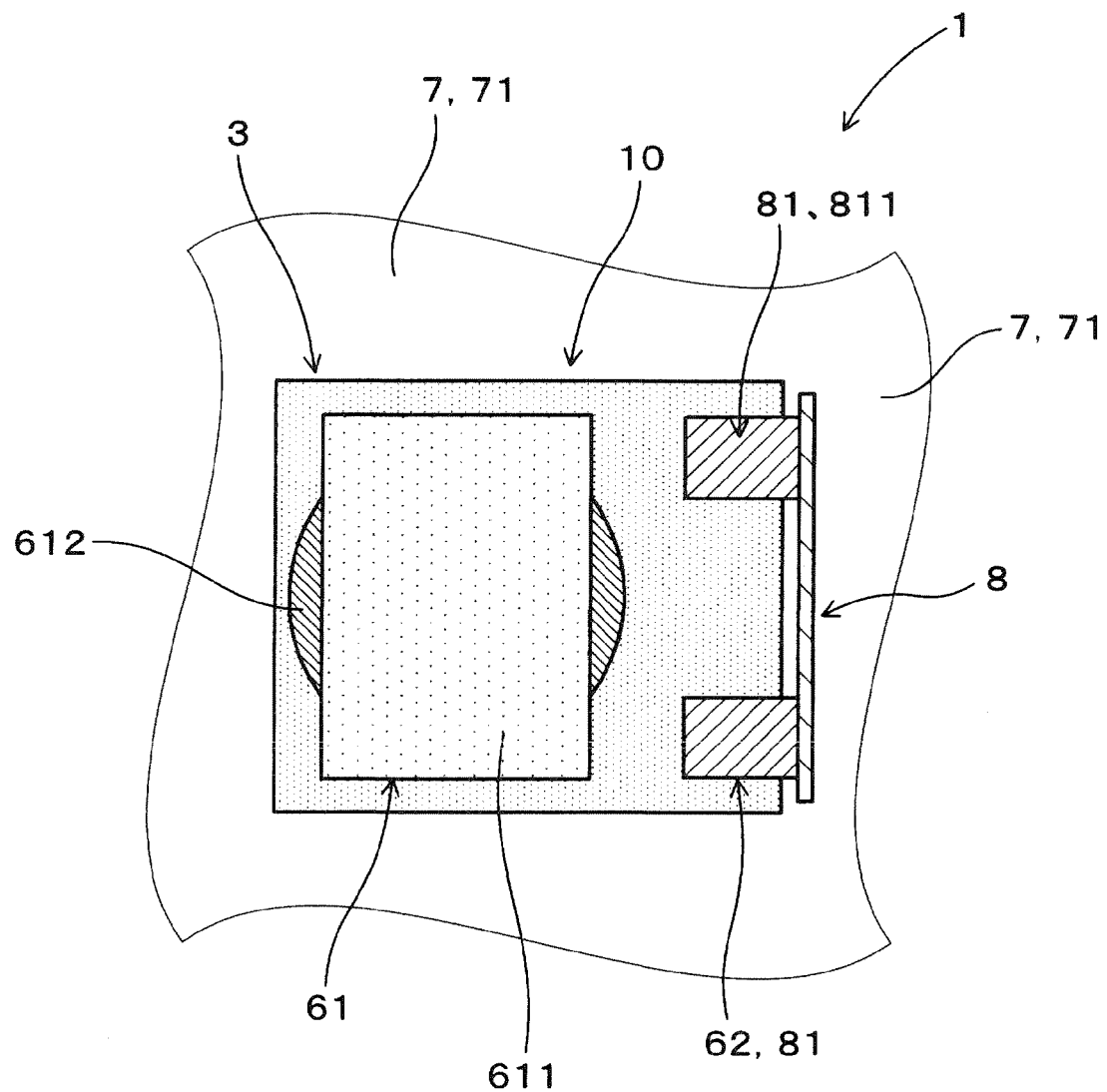
FIG. 7 is a sectional view showing the structure of the electric power source device taken along the line VII shown in FIG. 6.

FIG. 6 is an explanatory view showing a structure of an electric power source device according to the third exemplary embodiment. FIG. 7 is a sectional view showing the structure of the electric power source device taken along the line VII shown in FIG. 6. The electric power source device 1 according to the third exemplary embodiment shown in FIG. 6 and FIG. 7 is different in a part of the structure from the electric power source device 1 according to the second exemplary embodiment shown in FIG. 4 and FIG. 5.

The stacked section 10 of the electric power source device 1 according to the third exemplary embodiment has the structure in which a center line C1 of the primary side semiconductor module 3 is shifted from a center line C2 of the choke coil 61 by a predetermined length when viewed along the direction of the normal line N1 of the mounting surface 71 of the base plate 7. Specifically, the choke coil 61 is arranged at a left side which is more separated from the substrate side electrical components 81 when compared with the arrangement of the substrate side electrical components 81 shown in FIG. 4

The same components between the third exemplary embodiment and the first exemplary embodiment will be referred to with the same reference numbers.

In the structure of the electric power source device 1 according to the third exemplary embodiment, because the choke coil 61 is arranged at a left side which is opposing to the position of the substrate side electrical components 81, this makes it possible to expand the mounting available space formed between the substrate side electrical components 81, the choke coil 61 and the primary side semiconductor module 3. It is accordingly possible to arrange a large size component in the mounting available space formed around the stacked section 10 with high efficiency.

In addition, the electric power source device 1 according to the third exemplary embodiment has the same effects of the electric power source device 1 according to the first exemplary embodiment and the second exemplary embodiment.

Fourth Exemplary Embodiment

A description will be given of the electric power source device 1 according to the fourth exemplary embodiment with reference to FIG. 8.

Figure 8:
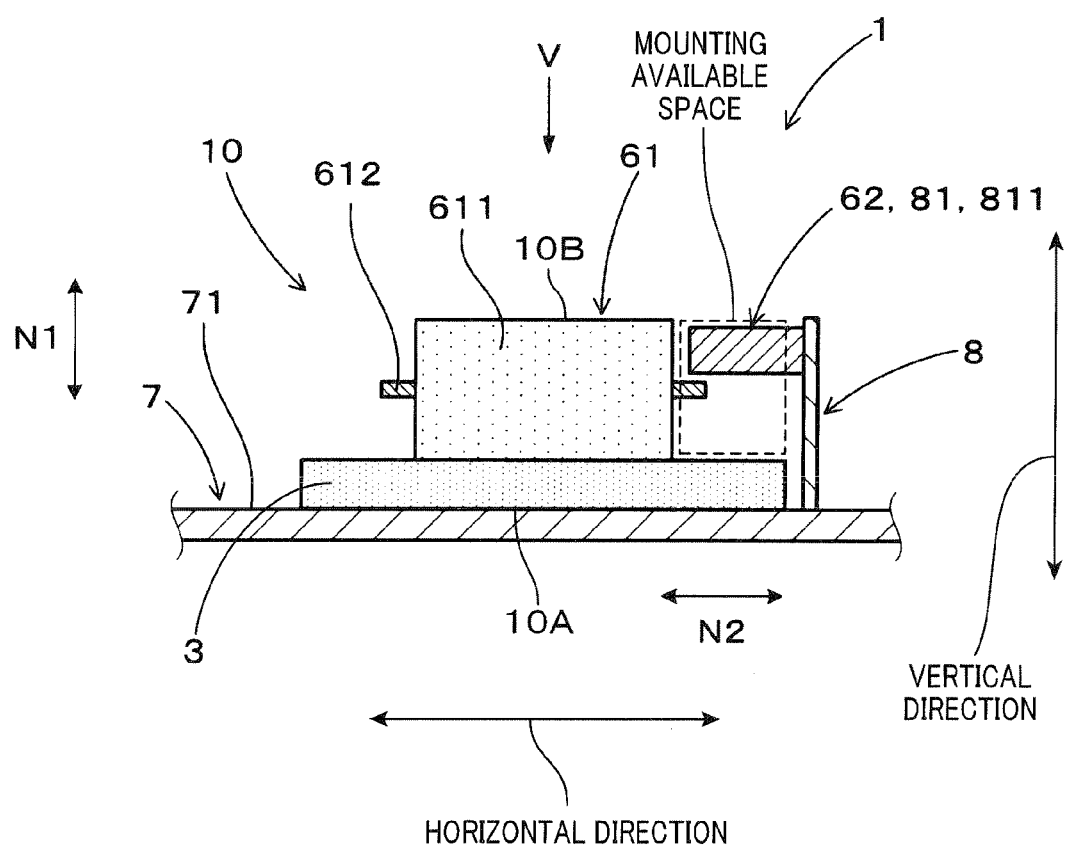
FIG. 8 is an explanatory view showing a structure of an electric power source device according to a fourth exemplary embodiment of the present invention.

FIG. 8 is an explanatory view showing a structure of an electric power source device according to the fourth exemplary embodiment. The electric power source device 1 according to the fourth exemplary embodiment shown in FIG. 8 is different in a part of the structure from the electric power source device 1 according to the second exemplary embodiment shown in FIG. 4 and FIG. 5.

In the structure of the electric power source device 1 according to the fourth exemplary embodiment shown in FIG. 8, the substrate side electrical components 81 formed on the circuit substrate 8 is arranged more next to the mounting surface 71 side than when compared with the arrangement of the substrate side electrical components 81 shown in FIG. 6. That is, the substrate side electrical components 81 are arranged more next to the mounting surface 71 side than to the second surface 18B of the stacked section 10 in the direction of the normal line N1 of the mounting surface 71 of the base plate 7 (i.e. in the vertical direction in FIG. 8).

The same components between the fourth exemplary embodiment and the first exemplary embodiment will be referred to with the same reference numbers.

In the improved structure of the electric power source device 1 according to the fourth exemplary embodiment shown in FIG. 8, the substrate side electrical components 81 are arranged next to the mounting surface 71 side when compared with the second surface 10B of the stacked section 19 when viewing the direction of the normal line N1 of the mounting surface 71 of the base plate 7, i.e. when viewed along the vertical direction. This structure makes it possible to arrange the substrate side electrical components 81 in the mounting available space formed by the choke coil 61 and the primary side semiconductor module 3, and to prevent the overall size of the electric power source device 1 from increasing. The fourth exemplary embodiment can provide the miniaturized electric power source device 1.

In addition, the electric power source device 1 according to the fourth exemplary embodiment has the same effects of the electric power source device 1 according to the first exemplary embodiment and the second exemplary embodiment.

Fifth Exemplary Embodiment

A description will be given of the electric power source device 1 according to the fifth exemplary embodiment with reference to FIG. 9.

Figure 9:
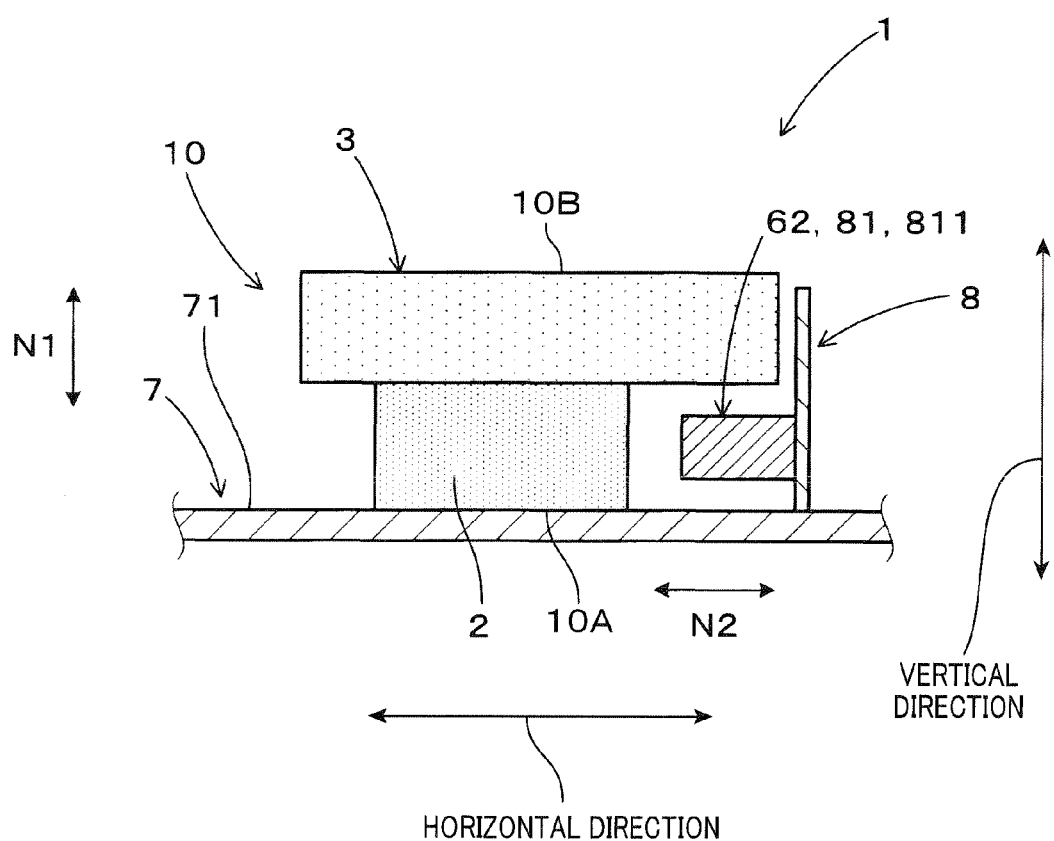
FIG. 9 is an explanatory view showing a structure of an electric power source device according to a fifth exemplary embodiment of the present invention.

FIG. 9 is an explanatory view showing a structure of the electric power source device 1 according to the fifth exemplary embodiment. The electric power source device 1 according to the fifth exemplary embodiment shown in FIG. 9 is different in a part of the structure from the electric power source device 1 according to the second exemplary embodiment shown in FIG. 4 and FIG. 5.

As shown in FIG. 9, the electric power source device 1 according to the fifth exemplary embodiment has the stacked section 10 in which the primary side semiconductor module 3 is stacked on the choke coil 61. The choke coil 61 is mounted on the mounting surface 71 of the base plate 7. When viewed along the direction along the normal line N1 of the mounting surface 71 of the base plate 7, the primary side semiconductor module 3 has a larger exterior size than the transformer 2. The transformer 2 is mounted directly on the mounting surface 71 of the base plate 7.

The substrate side electrical components 81 is mounted on the circuit substrate 8 to face the stacked section 10 comprised of the transformer 2 and the primary side semiconductor module 3. The substrate side electrical components 81 are arranged in a space surrounded by the mounting surface 71 of the base plate 7, the right side surface of the transformer 2, the bottom surface of the primary side semiconductor module 3 and the circuit substrate 8. The same components between the fifth exemplary embodiment and the first exemplary embodiment and the second exemplary embodiment will be referred to with the same reference numbers.

In the improved structure of the electric power source device 1 according to the fifth exemplary embodiment shown in FIG. 9, it is possible to arrange the substrate side electrical components 81 mounted on the circuit substrate 8 around the component having a small exterior size such as the transformer 2 even if the transformer 2 having a small exterior size is mounted directly on the mounting surface 71 of the base plate 7. This structure makes it possible to use the space around the stacked section 10 with high efficiency. The fifth exemplary embodiment provides the miniaturized electric power source device 1.

In addition, the electric power source device 1 according to the fifth exemplary embodiment has the same effects as the electric power source device 1 according to the first exemplary embodiment and the second exemplary embodiment.

Sixth Exemplary Embodiment

A description will be given of the electric power source device 1 according to the sixth exemplary embodiment with reference to FIG. 10 and FIG. 11.

Figure 10:
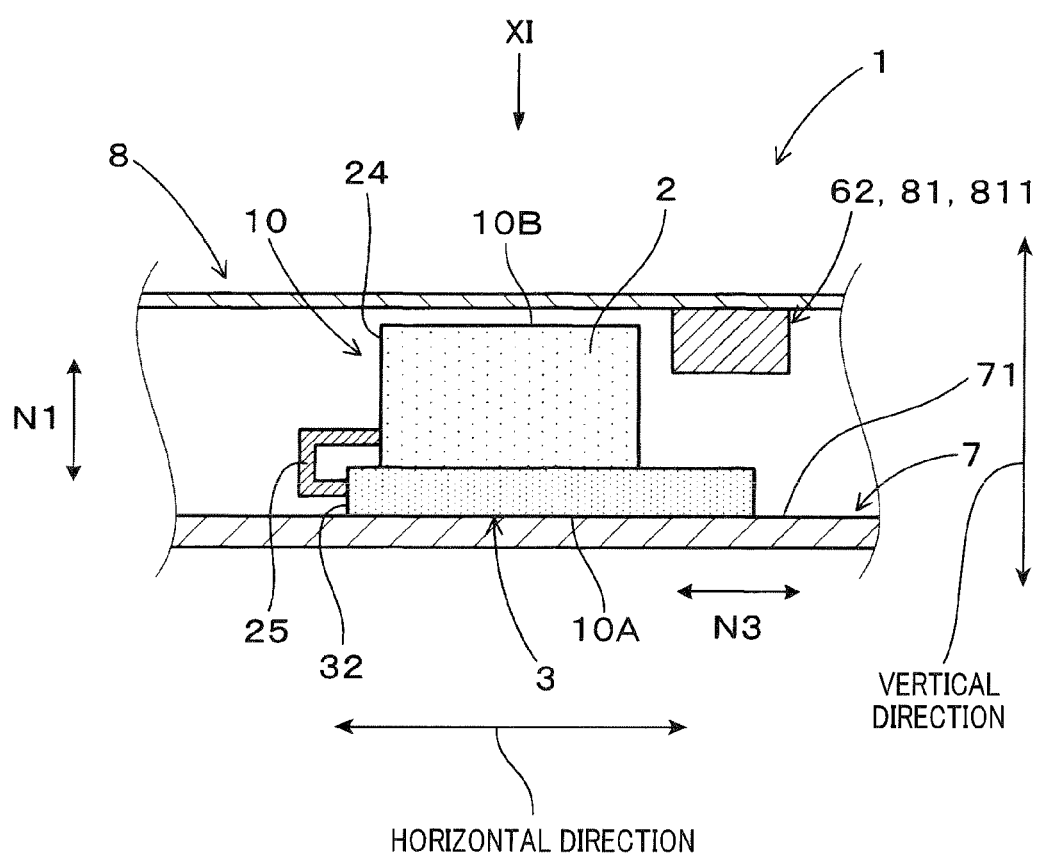
FIG. 10 is an explanatory view showing a structure of an electric power source device according to a sixth exemplary embodiment of the present invention.
Figure 11:
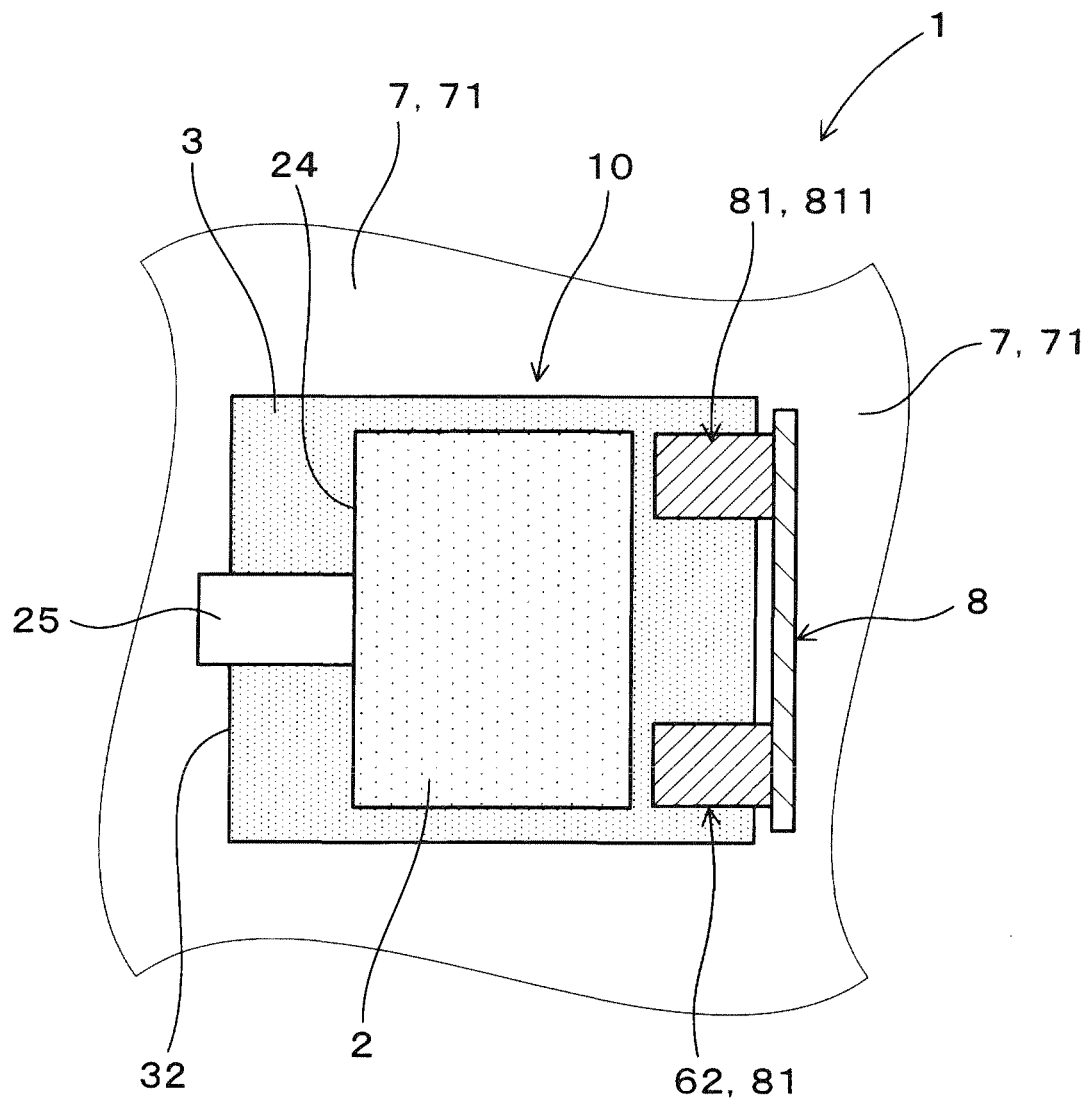
FIG. 11 is a sectional view showing the structure of the electric power source device taken along the line XI shown in FIG. 10.

FIG. 10 is an explanatory view showing a structure of an electric power source device according to the sixth exemplary embodiment. FIG. 11 is a sectional view showing the structure of the electric power source device taken along the line XI shown in FIG. 10. As shown in FIG. 10 and FIG. 11, the stacked section 10 is comprised of the primary side semiconductor module 3 and the transformer 2 which are stacked on the mounting surface 71 of the base plate 7 in the direction of the normal line N1 of the mounting surface 71 of the base plate 7. When viewing in the direction of the normal line N1, the primary side semiconductor module 3 has a larger exterior size than the transformer 2. Further, the primary side semiconductor module 3 is mounted directly on the mounting surface 71 of the base plate 7.

As shown in FIG. 10, the primary side semiconductor module 3 is electrically connected to the transformer 2 through a connection member 25 for the stacked layer 10. The connection member 25 has a curved shape in order to electrically connect a side surface 32 of the primary side semiconductor module 3 to a side surface 24 of the transformer 2 where the side surface 32 and the side surface 24 are arranged at the same side. The connection member 25 is arranged so that the connection member 25 is not in contact with the substrate side electrical components 81 mounted on the circuit substrate 8. That is, the connection member 25 is arranged at the left side of the stacked section 10 and the substrate side electrical components 81 is arranged at the right side of the stacked section 10.

In the structure of the electric power source device 1 according to the sixth exemplary embodiment, the connection member 25 and the substrate side electrical components 81 are arranged at opposing locations to each other when viewed along the arrangement of the stacked section 10.

The sixth exemplary embodiment shows one example of the arrangement of the connection member 25 and the substrate side electrical components 81. It is accordingly possible to change the location of the connection member 25 and the location of the substrate side electrical components 81. For example, it is possible to arrange the substrate side electrical components 81 at a location which faces a plane perpendicular to each of the side surface 24 and the side surface 32. The same components between the sixth exemplary embodiment and the first exemplary embodiment will be referred to with the same reference numbers.

In the improved structure of the electric power source device 1 according to the sixth exemplary embodiment, the connection member 25 and the substrate side electrical components 81 are arranged so that they are overlapped together when viewed along the direction of the normal line N1 of the mounting surface 71 of the base plate 7 (i.e. in the vertical direction in FIG. 10). This makes it possible to use the space formed around the transformer 2 in the stacked section 10 in order to effectively arrange the connection member 25 and the substrate side electrical components 81. The sixth exemplary embodiment provides the miniaturized electric power source device.

In addition, the electric power source device 1 according to the sixth exemplary embodiment has the same effects of the electric power source device 1 according to the first exemplary embodiment.

Seventh Exemplary Embodiment

A description will be given of the electric power source device 1 according to the seventh exemplary embodiment with reference to FIG. 12 and FIG. 13.

Figure 12:
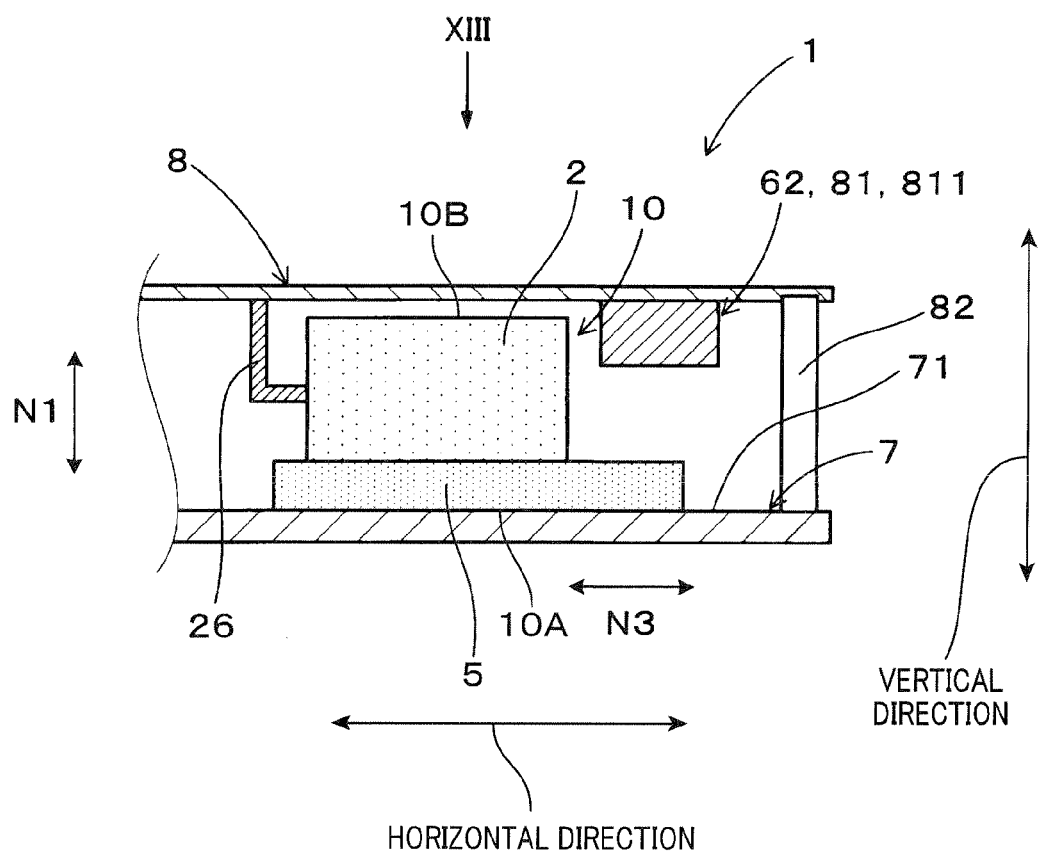
FIG. 12 is an explanatory view showing a structure of an electric power source device according to a seventh exemplary embodiment of the present invention.

FIG. 12 is an explanatory view showing a structure of an electric power source device 1 according to the seventh exemplary embodiment. FIG. 13 is a sectional view showing the structure of the electric power source device 1 taken along the line XIII shown in FIG. 12.

Figure 13:
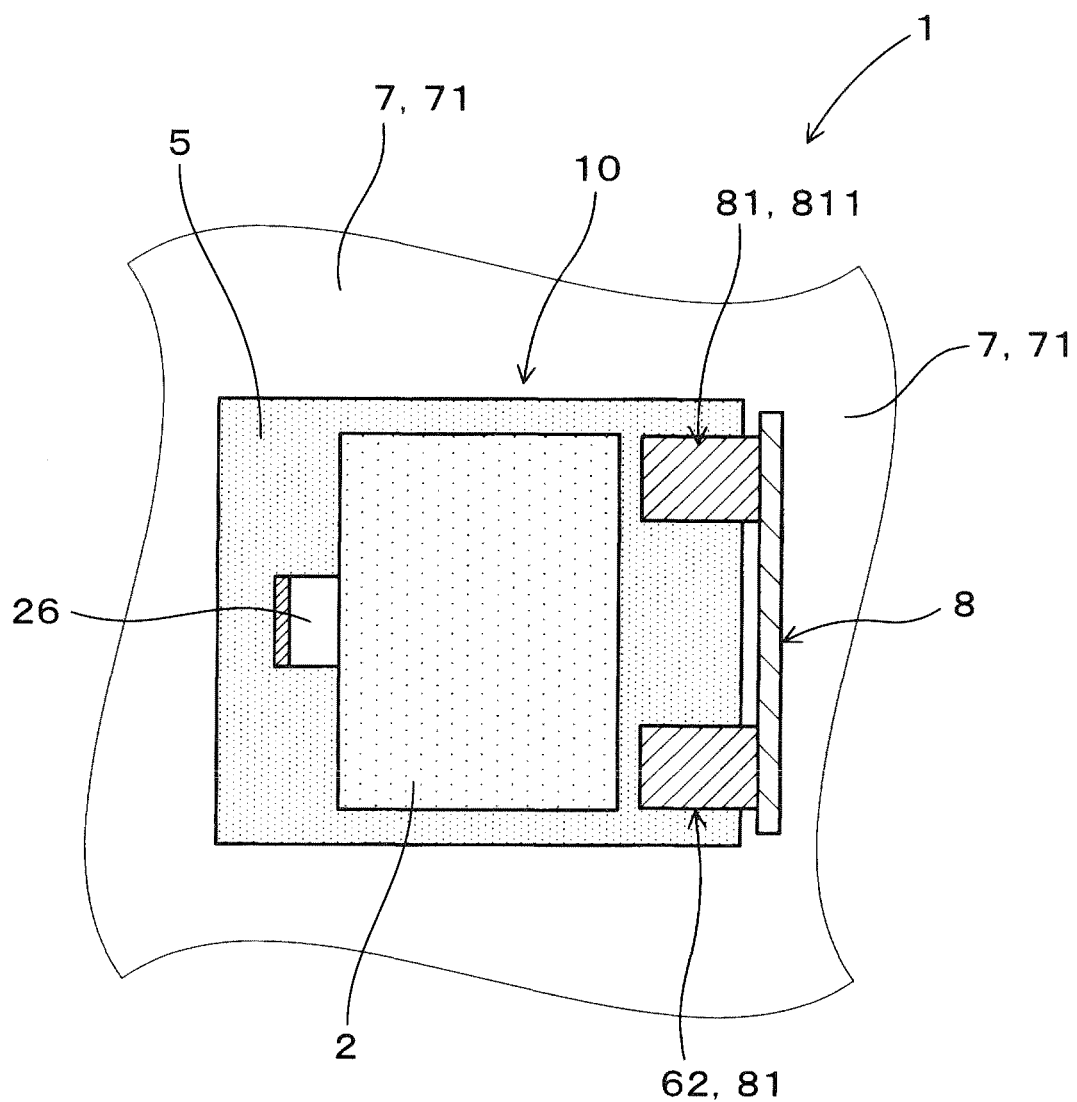
FIG. 13 is a sectional view showing the structure of the electric power source device taken along the line XIII shown in FIG. 12.

As shown in FIG. 12 and FIG. 13, the stacked section 10 is comprised of the secondary side semiconductor module 5 and the transformer 2 which are stacked in the direction of the normal line N1 of the mounting surface 71 of the base plate 7 (i.e. in the vertical direction in FIG. 12).

The secondary side semiconductor module 5 has a larger exterior size than the transformer 2 when viewing along the direction of the normal line N1. Further, the secondary side semiconductor module 5 is mounted directly on the mounting surface 71 of the base plate 7.

As shown in FIG. 12, the transformer 2 is electrically connected to the circuit substrate 8 through a circuit connection member 26.

The circuit connection member 26 is a ground line of the transformer 2. The circuit substrate 8 is made of a thick copper plate. The thick copper plate has a structure in which a surface of a substrate having an electric insulation is covered with a thick copper film. The thick copper film is electrically connected to the base plate 7 through a conductive member 82. The base plate 7 has a voltage potential of 0 V connected to the ground.

When viewed along the direction of the normal line N1 of the mounting surface 71 of the base plate 7, the circuit connection member 26 and the substrate side electrical components 81 are arranged so that the circuit connection member 26 and the substrate side electrical components 81 are not overlapped with each other.

In the improved structure of the electric power source device 1 according to the seventh exemplary embodiment, the circuit connection member 26 and the substrate side electrical components 81 are arranged at opposite locations to each other around the stacked section 10. That is, as clearly shown in FIG. 12, the circuit connection member 26 is arranged at the left side of the stacked section and the substrate side electrical components 81 are arranged at the right side of the stacked section 10 when viewed along a projecting direction N3 of the circuit connection member 26.

The seventh exemplary embodiment shows one example of the arrangement of the circuit connection member 26 and the substrate side electrical components 81. It is accordingly possible to change the location of the circuit connection member 26 and the location of the substrate side electrical components 81. For example, it is possible to arrange the substrate side electrical components 81 at a location which faces a plane which is perpendicular to the circuit connection member 26. The same components between the seventh exemplary embodiment and the first exemplary embodiment will be referred to with the same reference numbers.

In the improved structure of the electric power source device 1 according to the seventh exemplary embodiment, the circuit connection member 26 and the substrate side electrical components 81 are arranged so that the circuit connection member 26 and the substrate side electrical components 81 are not overlapped with each other when viewed in the direction of the normal line N1 of the mounting surface 71 of the base plate 7. This makes it possible to effectively arrange the circuit connection member 26 and the substrate side electrical components 81 in the space formed around the transformer 2 stacked on the primary side semiconductor module 3. The seventh exemplary embodiment provides the miniaturized electric power source device.

In addition, the electric power source device 1 according to the seventh exemplary embodiment has the same effects of the electric power source device 1 according to the first exemplary embodiment.

In the structure of the electric power source device 1 according to the seventh exemplary embodiment previously described and shown in FIG. 12 and FIG. 13, the transformer 2 is electrically connected to the circuit substrate 8 through the circuit connection member 26 as the ground line. However, the concept of the present invention is not limited by this structure. For example it is possible to electrically connect the transformer 2 to the base plate 7 through the circuit connection member 26.

Figure 14:
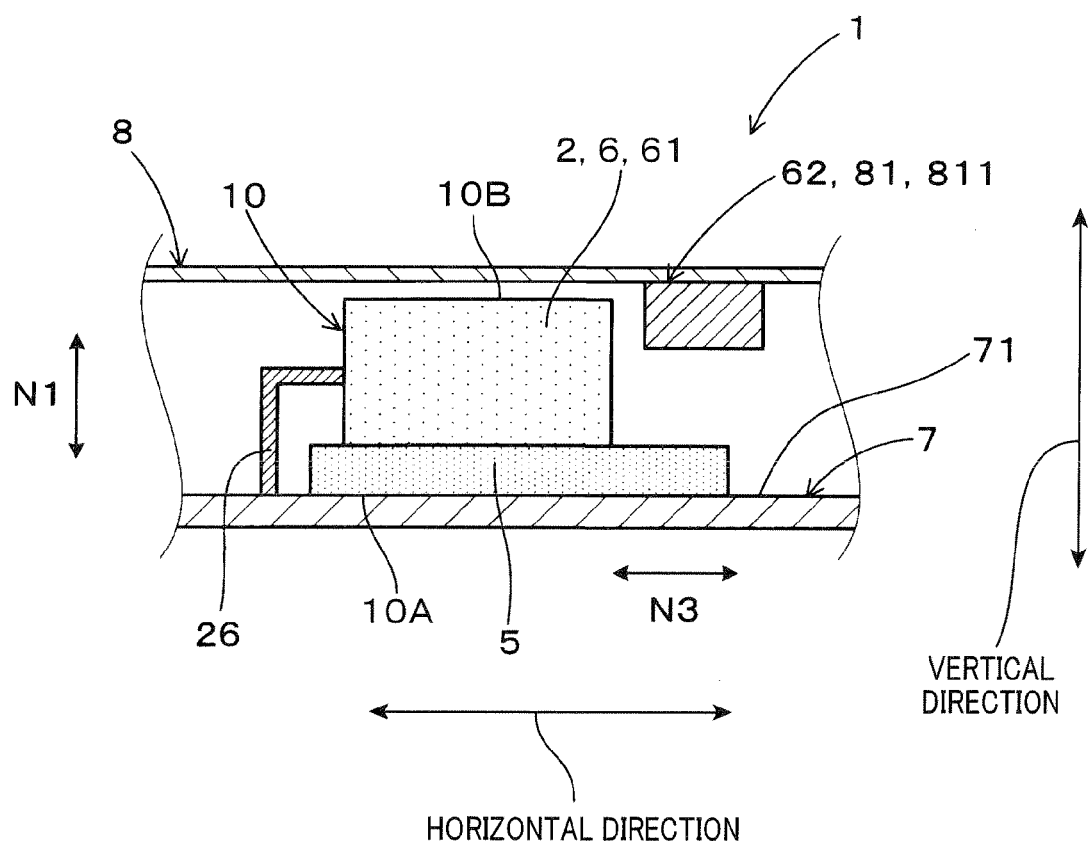
FIG. 14 is a view showing another structure of the electric power source device according to the seventh exemplary embodiment of the present invention.

FIG. 14 is a view showing a modification having another structure of the electric power source device 1 according to the seventh exemplary embodiment. In the structure shown in FIG. 14, the transformer 2 is electrically connected to the base plate 7 through the circuit connection member 26. It is possible to use a conductive plate made of a conductive member instead of the circuit substrate 8, and electrically connect the transformer 2 to the conductive plate through the circuit connection member 26.

Furthermore, it is possible to have a structure in which the stacked section 10 has the choke coil 61, and the choke coil 61 is electrically connected to the circuit substrate 8 through the circuit connection member 26. In this modification, it is also possible to electrically connect the secondary side semiconductor module 5 in the secondary side circuit 4 and the substrate side electrical components 81 to the choke coil 61 through the circuit connection member 26.

The structure of the electric power source device according to each of the first to seventh exemplary embodiments shows an example. The concept of the present invention is not limited by the structures of the electric power source devices. It is possible for the concept of the present invention to have various structures obtained by the combination of these structures. In addition, the stacked section 10 has a structure in which at least two selected from the primary side semiconductor module 3, the secondary side semiconductor module 5, the transformer 2 and the secondary side electrical components are stacked. For instance, it is possible to have a structure in which the primary side semiconductor module 3 and the secondary side semiconductor module 5 are stacked or the transformer 2 and the secondary side electrical component are stacked. There are the choke coil 61 and the filtering capacitor 62 etc. as the secondary side electrical components 6.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. An electric power source device comprising:
a transformer comprising a primary coil and a secondary coil;
primary side semiconductor components equipped with semiconductor elements and connected to the primary coil of the transformer;
secondary side semiconductor components equipped with semiconductor elements and connected to the secondary coil of the transformer;
a secondary side circuit formed by secondary side electrical components and the secondary side semiconductor components;
a base plate having a mounting surface on which the transformer, the primary side semiconductor components, the secondary side semiconductor components and the secondary side electrical components are mounted; and
a circuit substrate on which substrate side electrical components are mounted,
wherein at least two selected from the primary side semiconductor components, the secondary side semiconductor components, and a combination of the transformer and the secondary side semiconductor components are stacked to form a stacked section in a direction of a normal line of the mounting surface of the base plate, and
at least a part of the substrate side electrical components is arranged inside of an exterior part of a component having a maximum exterior size forming the stacked section in a horizontal direction, which is perpendicular to the direction of the normal line of the mounting surface of the base plate, and this part of the substrate side electrical components is arranged inside of a second surface of the stacked section toward the mounting surface side in a vertical direction, where the second surface of the stacked section is opposing to a first surface of the stacked section which is directly in contact with the mounting surface of the base plate when viewed in the vertical direction which is parallel to the direction of the normal line of the mounting surface.

2. The electric power source device according to claim 1, wherein at least one of the circuit substrates comprises a ground conductive layer formed in an expanding direction of its circuit substrate.

3. The electric power source device according to claim 1, wherein a filtering capacitance is used as the substrate side electrical component.

4. The electric power source device according to claim 2, wherein a filtering capacitance is used as the substrate side electrical component.

5. The electric power source device according to claim 1, wherein the stacked section has a structure in which the primary side semiconductor components and the transformer are stacked or the secondary side semiconductor components and the secondary side electrical component are stacked, and
the primary side semiconductor components are electrically connected to the transformer or the secondary side semiconductor components are electrically connected to the secondary side electrical component through a connection member, and the connection member and the substrate side electrical component are arranged to prevent the connection member from being overlapped with the substrate side electrical component when viewed in the direction of the normal line of the mounting surface of the base plate.

6. The electric power source device according to claim 2, wherein the stacked section has a structure in which the primary side semiconductor components and the transformer are stacked or the secondary side semiconductor components and the secondary side electrical component are stacked, and the primary side semiconductor components are electrically connected to the transformer or the secondary side semiconductor components are electrically connected to the secondary side electrical component, through a connection member, and the connection member and the substrate side electrical component are arranged to prevent the connection member from being overlapped with the substrate side electrical component when viewed in the direction of the normal line of the mounting surface of the base plate.

7. The electric power source device according to claim 3, wherein the stacked section has a structure in which the primary side semiconductor components and the transformer are stacked or the secondary side semiconductor components and the secondary side electrical component are stacked, and the primary side semiconductor components are electrically connected to the transformer or the secondary side semiconductor components are electrically connected to the secondary side electrical component, through a connection member, and the connection member and the substrate side electrical component are arranged to prevent the connection member from being overlapped with the substrate side electrical component when viewed in the direction of the normal line of the mounting surface of the base plate.

8. The electric power source device according to claim 1, wherein the stacked section has at least one selected from the secondary side semiconductor components and the transformer, and at least one selected from the secondary side semiconductor components and the transformer is electrically connected to the base plate or the circuit substrate through a circuit connection member, and the circuit connection member and the substrate side electrical component are arranged to prevent the circuit connection member from being overlapped with the substrate side electrical component when viewed along the direction of the normal line of the mounting surface of the base plate.

9. The electric power source device according to claim 2, wherein the stacked section has at least one selected from the secondary side semiconductor components and the transformer, and at least one selected from the secondary side semiconductor components and the transformer is electrically connected to the base plate or the circuit substrate through a circuit connection member, and the circuit connection member and the substrate side electrical component are arranged to prevent the circuit connection member from being overlapped with the substrate side electrical component when viewed in the direction of the normal line of the mounting surface of the base plate.

10. The electric power source device according to claim 3, wherein the stacked section has at least one selected from the secondary side semiconductor components and the transformer, and at least one selected from the secondary side semiconductor components and the transformer is electrically connected to the base plate or the circuit substrate through a circuit connection member, and the circuit connection member and the substrate side electrical component are arranged to prevent the circuit connection member from being overlapped with the substrate side electrical component when viewed in the direction of the normal line of the mounting surface of the base plate.

11. The electric power source device according to claim 1, wherein the circuit substrate is arranged so that a direction of a normal line of the circuit substrate intersects the direction of the normal line of the mounting surface of the base plate.

12. The electric power source device according to claim 2, wherein the circuit substrate is arranged so that a direction of a normal line of the circuit substrate intersects the direction of the normal line of the mounting surface of the base plate.

13. The electric power source device according to claim 3, wherein the circuit substrate is arranged so that a direction of a normal line of the circuit substrate intersects the direction of the normal line of the mounting surface of the base plate.

* * * * *